(12) United States Patent
Oh et al.

(10) Patent No.: US 9,368,180 B2
(45) Date of Patent: Jun. 14, 2016

(54) VARIABLE RESISTANCE MEMORY DEVICE AND STORAGE DEVICES USING THE SAME

(71) Applicant: SK hynix Inc., Icheon-Si (KR)

(72) Inventors: Byoung-Chan Oh, Icheon-Si (KR); Dong-Keun Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/511,089

(22) Filed: Oct. 9, 2014

(65) Prior Publication Data

US 2015/0103587 A1  Apr. 16, 2015

(30) Foreign Application Priority Data

Oct. 15, 2013  (KR) .................. 10-2013-0122660

(51) Int. Cl.
*G11C 11/16* (2006.01)
*G11C 29/00* (2006.01)
*G11C 29/12* (2006.01)
*G11C 29/48* (2006.01)
*G11C 29/50* (2006.01)

(52) U.S. Cl.
CPC ............ *G11C 11/1675* (2013.01); *G11C 11/16* (2013.01); *G11C 11/161* (2013.01); *G11C 11/1697* (2013.01); *G11C 29/1201* (2013.01); *G11C 29/48* (2013.01); *G11C 29/84* (2013.01); *G11C 2029/5006* (2013.01)

(58) Field of Classification Search
CPC ............. G11C 11/1675; G11C 11/161; G11C 29/021; G11C 11/1697; G11C 29/84; G11C 11/56; G11C 11/16; G11C 29/10; G11C 29/48; G06F 11/00
See application file for complete search history.

(56) References Cited

U.S. PATENT DOCUMENTS

| | | | |
|---|---|---|---|
| 2003/0090935 A1* | 5/2003 | Hidaka | 365/171 |
| 2008/0232161 A1* | 9/2008 | Choi et al. | 365/163 |
| 2011/0292745 A1* | 12/2011 | Ku | 365/189.16 |
| 2012/0069683 A1* | 3/2012 | Kamata et al. | 365/185.25 |
| 2014/0022836 A1* | 1/2014 | Kim et al. | 365/158 |
| 2014/0059268 A1* | 2/2014 | Adachi et al. | 711/102 |
| 2014/0095643 A1* | 4/2014 | Pean et al. | 709/212 |
| 2015/0049538 A1* | 2/2015 | Okubo et al. | 365/148 |

FOREIGN PATENT DOCUMENTS

KR  10-2005-0118332 A  12/2005

* cited by examiner

*Primary Examiner* — Richard Elms
*Assistant Examiner* — Ajay Ojha
(74) *Attorney, Agent, or Firm* — Perkins Coie LLP

(57) ABSTRACT

In an electronic device including a semiconductor memory, the semiconductor memory may include a unit storage cell including a variable resistor having a resistance value that is changed according to current flowing through both terminals of the variable resistor and a selection element that is electrically coupled to one terminal of the variable resistor, a unit current generation section that generates the current flowing through both terminals by using predetermined voltage according to a polarity of current data as compared with existing data, and a pad that receives the predetermined voltage from an exterior and allows the current flowing through both terminals to be measured from an exterior.

20 Claims, 10 Drawing Sheets

FIG. 6

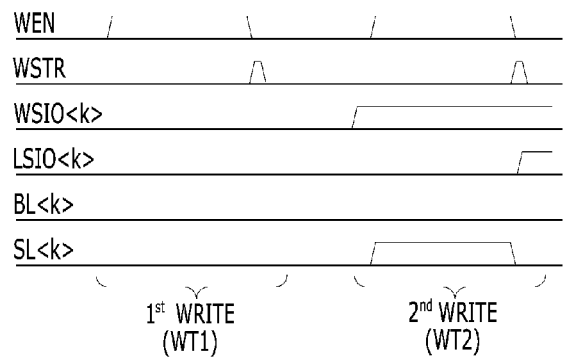

1st WRITE (WT1)    2nd WRITE (WT2)

FIG. 7

| WEN | WSIOB | LSIOB | GBLDIS | COMPOFFB | BL@WDRV | SL@WDRV | Operation |
|---|---|---|---|---|---|---|---|
| Low | Any value | Any value | Low | Any value | High-Z | High-Z | Read |
| Low | Any value | Any value | High | Any value | Low | Low | No operation (Standby) |
| High | Any value | Any value | Low | Any value | High-Z | High-Z | *Illegal operation |
| High | Low | Any value | High | Low | High | Low | Write '1' |
| High | Low | Low | High | High | Low | Low | Ignoring write CMD |
| High | Low | High | High | High | High | Low | Write '1' |
| High | High | Any value | High | Low | Low | High | Write '0' |
| High | High | Low | High | High | Low | High | Write '0' |
| High | High | High | High | High | Low | Low | Ignoring write CMD |

| | 1st Burst | 2nd Burst | 3rd Burst | 4th Burst |
|---|---|---|---|---|
| DQ0 | 0 | 0 | 0 | 0 |
| DQ1 | 0 | 0 | 0 | 0 |
| DQ2 | 0 | 0 | 0 | 0 |
| DQ3 | 0 | 0 | 0 | 0 |
| DQ4 | 0 | 0 | 0 | 0 |
| DQ5 | 0 | 0 | 0 | 0 |
| DQ6 | 0 | 0 | 0 | 0 |
| DQ7 | 0 | 0 | 0 | 0 |
| DQ8 | 0 | 0 | 0 | 0 |
| DQ9 | 0 | 0 | 0 | 0 |
| DQ10 | 0 | 0 | 0 | 0 |
| DQ11 | 0 | 0 | 0 | 0 |
| DQ12 | 0 | 0 | 0 | 0 |
| DQ13 | 0 | 0 | 0 | 0 |
| DQ14 | 0 | 0 | 0 | 0 |
| DQ15 | 0 | 0 | 0 | 0 |
| DQ16 | 0 | 0 | 0 | 0 |
| DQ17 | 0 | 0 | 0 | 0 |
| DQ18 | 0 | 0 | 0 | 0 |
| DQ19 | 0 | 0 | 0 | 0 |
| DQ20 | 0 | 0 | 0 | 0 |
| DQ21 | 0 | 0 | 0 | 0 |
| DQ22 | 0 | 0 | 0 | 0 |
| DQ23 | 0 | 0 | 0 | 0 |
| DQ24 | 0 | 0 | 0 | 0 |
| DQ25 | 0 | 0 | 0 | 0 |
| DQ26 | 0 | 0 | 0 | 0 |
| DQ27 | 0 | 0 | 0 | 0 |
| DQ28 | 0 | 0 | 0 | 0 |
| DQ29 | 0 | 0 | 0 | 0 |
| DQ30 | 0 | 0 | 0 | 0 |
| DQ31 | 0 | 0 | 0 | 0 |

1st WRITE

| | 1st Burst | 2nd Burst | 3rd Burst | 4th Burst |
|---|---|---|---|---|
| DQ0 | 0 | 0 | 0 | 0 |
| DQ1 | 0 | 0 | 0 | 0 |
| DQ2 | 0 | 0 | 0 | 0 |
| DQ3 | 0 | 0 | 0 | 0 |
| DQ4 | 0 | 0 | 0 | 0 |
| DQ5 | 0 | 0 | 0 | 0 |
| DQ6 | 0 | 0 | 0 | 0 |
| DQ7 | 0 | 0 | 0 | 0 |
| DQ8 | 0 | 0 | 0 | 0 |
| DQ9 | 0 | 0 | 0 | 0 |
| DQ10 | 0 | 0 | 0 | 0 |
| DQ11 | 0 | 0 | 0 | 0 |
| DQ12 | 0 | 0 | 0 | 0 |
| DQ13 | 0 | 0 | 0 | 0 |
| DQ14 | 0 | 1 | 0 | 0 |
| DQ15 | 0 | 0 | 0 | 0 |
| DQ16 | 0 | 0 | 0 | 0 |
| DQ17 | 0 | 0 | 0 | 0 |
| DQ18 | 0 | 0 | 0 | 0 |
| DQ19 | 0 | 0 | 0 | 0 |
| DQ20 | 0 | 0 | 0 | 0 |
| DQ21 | 0 | 0 | 0 | 0 |
| DQ22 | 0 | 0 | 0 | 0 |
| DQ23 | 0 | 0 | 0 | 0 |
| DQ24 | 0 | 0 | 0 | 0 |
| DQ25 | 0 | 0 | 0 | 0 |
| DQ26 | 0 | 0 | 0 | 0 |
| DQ27 | 0 | 0 | 0 | 0 |
| DQ28 | 0 | 0 | 0 | 0 |
| DQ29 | 0 | 0 | 0 | 0 |
| DQ30 | 0 | 0 | 0 | 0 |
| DQ31 | 0 | 0 | 0 | 0 |

2nd WRITE

VARIABLE RESISTANCE MEMORY DEVICE AND STORAGE DEVICES USING THE SAME

CROSS-REFERENCE TO RELATED APPLICATIONS

This patent document claims priority of Korean Patent Application No. 10-2013-0122660, entitled "ELECTRONIC DEVICE AND METHOD OF DRIVING THE SAME" and filed on Oct. 15, 2013, which is incorporated herein by reference in its entirety.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such semiconductor devices include electronic devices which can store data using a characteristic switched between different resistance states according to applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device capable of selectively measuring cell current flowing through one or more of a plurality of storage cells, and a method for driving the same.

In one aspect, an electronic device is provided to include a semiconductor memory which includes: a unit storage cell including a variable resistance element having a resistance value that can be changed according to a current flowing through the variable resistance element; a unit current generation section coupled to the unit storage cell to compare existing data stored in the unit storage cell with write data to be stored in the unit storage cell to produce a comparison result, and generates the current to be supplied to the unit storage cell by using external power according to the comparison result; and a pad coupled to the unit current generation section to receive the external power from an exterior and to allow the current to be measured from an exterior.

In some implementations, the unit current generation section may generate the current when the write data having a value different from a value of the existing data is inputted.

In some implementations, the unit current generation section may include: a comparison part that compares the existing data with the write data; and a driver that is electrically coupled between the pad and a ground voltage terminal, and may generate the current in response to the comparison result of the comparison part.

In some implementations, the variable resistance element includes a tunnel barrier layer interposed among metal oxide, phase change material, and two magnetic layers.

In some implementations, the unit storage cell may further include: a selection element that is electrically coupled to the variable resistance element to supply the current to the variable resistance element.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In some implementations, the semiconductor memory includes: a plurality of additional unit storage cells, each additional unit storage cell being similarly constructed as the unit storage cell to include a corresponding variable resistance element having a resistance value that can be changed according to a corresponding current flowing through the corresponding variable resistance element; a plurality of unit storage sections that store existing write data corresponding to the additional unit storage cells and the unit storage cell, respectively, in response to a common write store signal; a plurality of additional unit current generation sections that are coupled to the additional storage cells, respectively, each additional unit current generation section being similarly structured as the unit current generation section to compare existing write data with current write data in response to a common write enable signal applied to each additional unit current generation section and the unit current generation section, to produce a corresponding comparison result, and to selectively generate the corresponding current in a corresponding additional unit storage cell by using the external power according to the corresponding comparison result; and wherein the common pad is coupled to provide the received external power to the additional unit current generation sections and allow a corresponding current flowing through each additional unit storage cells to be measured from an exterior.

In another aspect, an electronic device is provided to include a semiconductor memory which includes: a plurality of unit storage cells including a variable resistance element having a resistance value that is changed according to current flowing through both terminals of the variable resistance element, respectively; a plurality of unit storage sections that store existing write data corresponding to the plurality of unit storage cells in response to a common write store signal; a plurality of unit current generation sections that compare the existing write data with current write data in response to a common write enable signal, and selectively generate current in the plurality of unit storage cells by using external power according to a comparison result; and a common pad that receives the external power from an exterior and allows the current flowing through one or more of the plurality of unit storage cells to be measured from an exterior.

In some implementations, among the plurality of unit current generation sections, a unit current generation section may supply current to a unit storage cell corresponding to the unit current generation section among the plurality of unit storage cells when the existing write data and the current write data have different values as a result obtained by comparing the existing write data with the current write data.

In some implementations, each of the plurality of unit current generation sections may include: a comparison part that compares the existing write data with the current write data; and a write driver that is electrically coupled between the common pad and a ground voltage terminal, and may supply current to a unit storage cell corresponding to the write driver among the plurality of unit storage cells according to a comparison result of the comparison part.

In some implementations, the electronic device may further include: a common write enable section that may generate the common write enable signal in response to a test mode signal and a write command, wherein the common write enable section lengthens an activation width when the test mode signal is activated, as compared with a case in which the test mode signal is deactivated, and may generate the common write enable signal.

In some implementations, the electronic device may further include: a plurality of bit lines electrically coupled to first terminals of the additional unit storage cells and the unit storage cell, respectively; and a plurality of source lines electrically coupled to second terminals of the additional unit storage cells and the unit storage cell, respectively, wherein each unit current generation section for each unit storage cell is electrically coupled between a corresponding bit line and a corresponding source lines coupled to the unit storage.

In some implementations, the electronic device may further include: a plurality of unit sense amplifiers that may be electrically coupled to the plurality of bit lines, respectively, and amplify a plurality of read data transmitted through the plurality of bit lines in a read mode, wherein the plurality of unit storage sections store the plurality of read data in response to a common read enable signal.

In some implementations, the variable resistance element includes one or more of structures in which tunnel barrier layers may be interposed among metal oxide, phase change material, and two magnetic layers.

In some implementations, each unit storage cell may further include: a selection element that is electrically coupled to the variable resistance element to supply current to the variable resistance element.

In another aspect, a method for driving an electronic device including a semiconductor memory is provided. The method may include: a first write step of supplying current to N unit storage cells by using external power supplied through a common pad from an exterior when N first data with a first value is inputted; a second write step of supplying current to K unit storage cells corresponding to a second value among the N unit storage cells by using the external power when second data with K second values and N-K first values is inputted; and a first current measurement step of measuring target current corresponding to the K unit storage cells through the common pad.

In some implementations, the method may further include, after the first write step, a third write step in which N third data with the first value is inputted; and a second current measurement step of measuring a unit current flowing through each unit storage cell through the common pad.

In some implementations, the method may further include, after the first current measurement step, a current calculation step of calculating storage current flowing through the K unit storage cells by subtracting the unit current from the target current.

In some implementations, the method may further include, after the first write step, a temporal storage step of temporally storing the N first data in N unit storage sections.

In some implementations, the second write step may include a data comparison step of comparing the N first data with the N second data; and a current supply step of supplying the target current to the K unit storage cells corresponding to the second value according to a comparison result of the data comparison step.

In some implementations, each unit storage cell may include: a variable resistance element having a resistance value that is changed according to current flowing therethrough.

In some implementations, the unit storage cell may further include: a selection element that is electrically coupled to one terminal of the variable resistance element to supply current to the variable resistance element.

In another aspect, a method for driving an electronic device including a semiconductor memory is provided. The method may include: providing first data to be written in unit storage cells, each first data having a first value; supplying current to each unit storage cell such that each first data is written in a corresponding unit storage cell; providing second data to be written in a particular unit storage cell, second data having a second value different from the first value; supplying current to the particular unit storage cell such that data of the particular unit storage cell changes from the first value to the second value; and detecting and measuring current flowing through the particular unit storage cell using an external pad.

In some implementations, the supplying of current may include receiving a voltage form outside using the external pad; and generating current to be supplied using the received voltage. Each unit storage cell may include a variable resistance element having a resistance value that is changed according to current flowing therethrough According to the aforementioned implementations, it is possible to measure cell current flowing through one or more storage cells, thereby obtaining an accurate distribution of the cell current.

Furthermore, it is possible to measure cell current flowing through one or more storage cells without a separate additional circuit, which results in providing advantages in terms of an area.

BRIEF DESCRIPTION OF THE DRAWINGS

FIGS. 6 through 8 are diagrams for explaining a driving method of a memory circuit illustrated in FIG. 3.

DETAILED DESCRIPTION

Various examples and implementations of the disclosed technology are described below in detail with reference to the accompanying drawings.

A semiconductor device in accordance with implementations of the present disclosure may include a variable resistance element. In the following descriptions, a variable resistance element may exhibit a resistance variable characteristic and may include a single layer or a multi-layer. For example, a variable resistance element may include substances used in an RRAM, a PRAM, an MRAM, an FRAM, and so forth, for example, a chalcogenide-based compound, a transition metal compound, a ferroelectric, a ferromagnetic, and so forth. However, the present implementations are not limited thereto. The variable resistance element may include any materials as long as the materials have a variable resistance characteristic of which resistance state is switched between different resistance states according to a voltage or current applied thereto.

For example, a variable resistance element may include a metal oxide. For example, the metal oxide may include a transition metal oxide such as a nickel (Ni) oxide, a titanium (Ti) oxide, a hafnium (Hf) oxide, a zirconium (Zr) oxide, a tungsten (W) oxide, or a cobalt (Co) oxide, or a perovskite-based substance such as STO (SrTiO) or PCMO (PrCaMnO). Such a variable resistance element may exhibit a characteristic that it is switched between different resistance states due to creation and extinction of current filaments through behavior of vacancies.

A variable resistance element may include a phase change substance. For example, the phase change substance may be a chalcogenide-based substance such as GST (Ge—Sb—Te). This variable resistance element may exhibit a characteristic that it is switched between different resistance states by being stabilized in a crystalline state and an amorphous state by heat.

Further, a variable resistance element may include a structure in which a tunneling barrier layer is interposed between two ferromagnetic layers. The ferromagnetic layers may be formed using a substance such as NiFeCo or CoFe, and the tunneling barrier layer may be formed using a substance such as $Al_2O_3$. The variable resistance element may exhibit a characteristic that it is switched between different resistance states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistant state.

Figure 1:
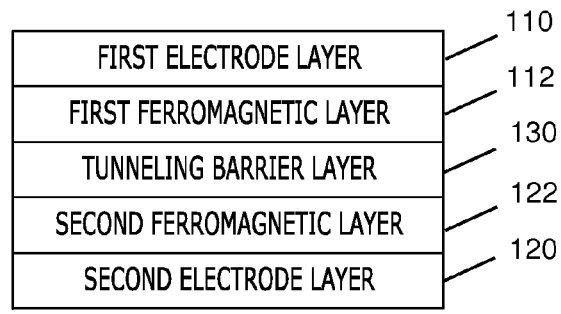
FIG. 1 is a diagram showing an example of a magnetic tunnel junction (MTJ) element including a tunneling barrier layer interposed between two ferromagnetic layers.

FIG. 1 is a diagram showing an example of a magnetic tunnel junction (MTJ) element including a tunneling barrier layer interposed between two ferromagnetic layers.

Referring to FIG. 1, an MTJ element 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of the first and second ferromagnetic layers 112 and 122.

The first ferromagnetic layer 112 may be a free ferromagnetic layer of which magnetization direction may be changed according to a direction of current applied to the MTJ element 100, and the second ferromagnetic layer 122 may be a pinned ferromagnetic layer of which magnetization direction is pinned.

The MTJ element 100 operates to store data "0" or "1" as the resistance value is changed to a low value or high value, respectively, according to a direction of the current.

Figure 2A:
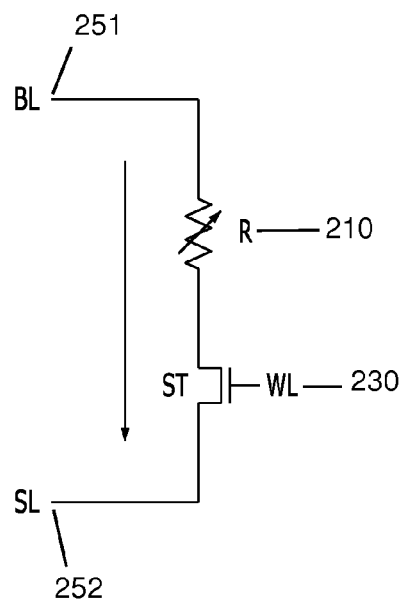
FIGS. 2A and 2B are diagrams explaining an example of operation for storing data in a variable resistance element.
Figure 2B:
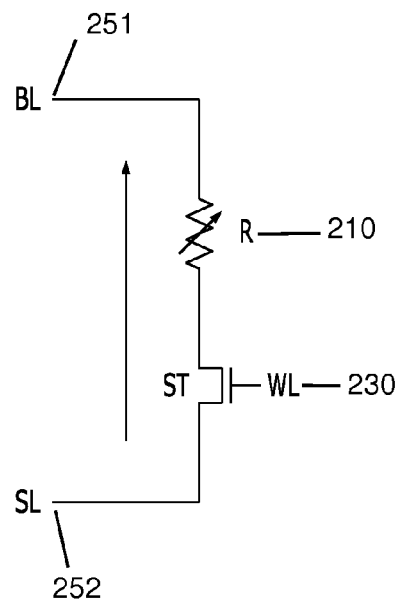

FIGS. 2A and 2B are diagrams of two examples of circuit operation configurations where a variable resistance element 210 exhibits two different resistance values for explaining storing data in a variable resistance element 210. The variable resistance element 210 exhibits two different resistance values when the current is directed in two opposite directions and may include the MTJ element 100 described with reference to FIG. 1 to achieve this property.

FIG. 2A is a diagram explaining an example of an operation for recording data of a low logic value in the variable resistance element 210. In order to select the variable resistance element 210 for storing data, a word line 230 coupled to the variable resistance element 210 is activated to turn on a transistor 220. As a current flows from one end 251 to the other end 252 (in the direction indicated by the arrow), that is, from the first electrode layer 110 as a top electrode to the second electrode layer 120 as a bottom electrode in the MTJ element 100 shown in FIG. 1, the magnetization direction of the first ferromagnetic layer 112 as a free ferromagnetic layer and the magnetization direction of the second ferromagnetic layer 122 as a pinned ferromagnetic layer become parallel to each other, and the variable resistance element 210 is in a low resistant state. When the variable resistance element 210 is in the low resistant state, it is defined that 'low' data is stored in the variable resistance element 210.

FIG. 2B is a diagram explaining recording data of a high logic value in the variable resistance element 210. In a similar manner, the word line 230 coupled to the variable resistance element 210 is activated to turn on the transistor 220. As a current flows from the other end 252 to one end 251 (in the direction indicated by the arrow), that is, from the second electrode layer 120 to the first electrode layer 110 in the MTJ element 100 shown in FIG. 1, the magnetization direction of the first ferromagnetic layer 112 and the magnetization direction of the second ferromagnetic layer 122 become antiparallel to each other, and the variable resistance element 210 is in a high resistant state. When the variable resistance element 210 is in the high resistant state, it is defined that 'high' data is stored in the variable resistance element 210.

The logic value of the data stored in the variable resistance element 210 is changed according to the resistance value of the variable resistance element 210. In the case where there exists a large difference in the resistance values between the high resistant state and the low resistant state, it is easy to discriminate the data stored in the variable resistance element 210 by discriminating two different logic states with a high accuracy based on the two significantly different resistance values. In the case where there exists a small difference in the resistance values between the high resistant state and the low resistant state, it is difficult to discriminate the data stored in the variable resistance element 210, because an error is more or highly likely to occur during the data determination when the two different resistance values are not significantly different from each other. Therefore, there is a demand or need for a technique capable of precisely discriminating the data stored in a variable resistance element even when there exists a small difference in the resistance values between the high resistance state and the low resistance state of the variable resistance element.

Figure 3:
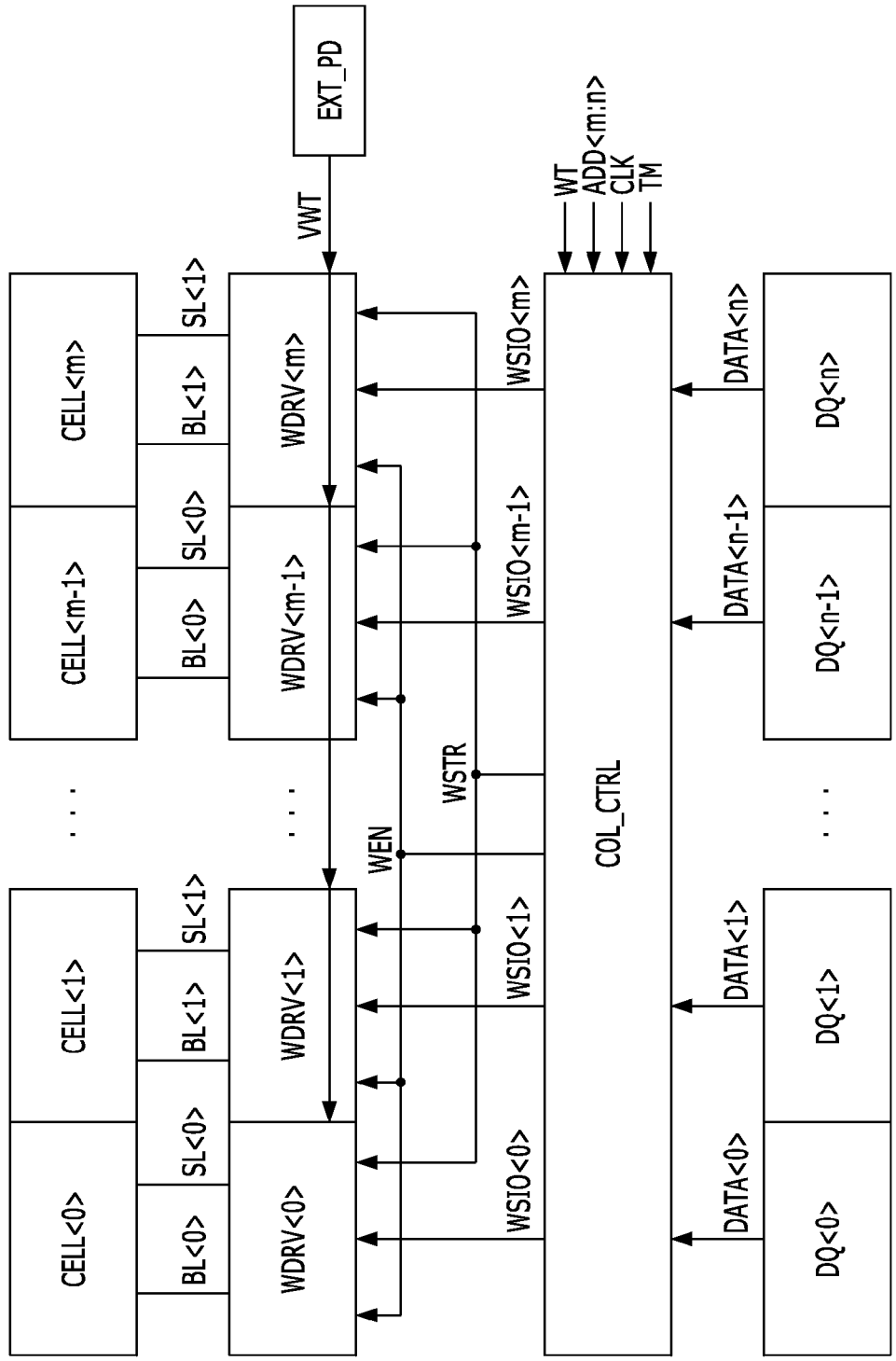
FIG. 3 is a configuration diagram of an example of a memory circuit in accordance with one implementation of the disclosed technology in the patent document.
Figure 4:
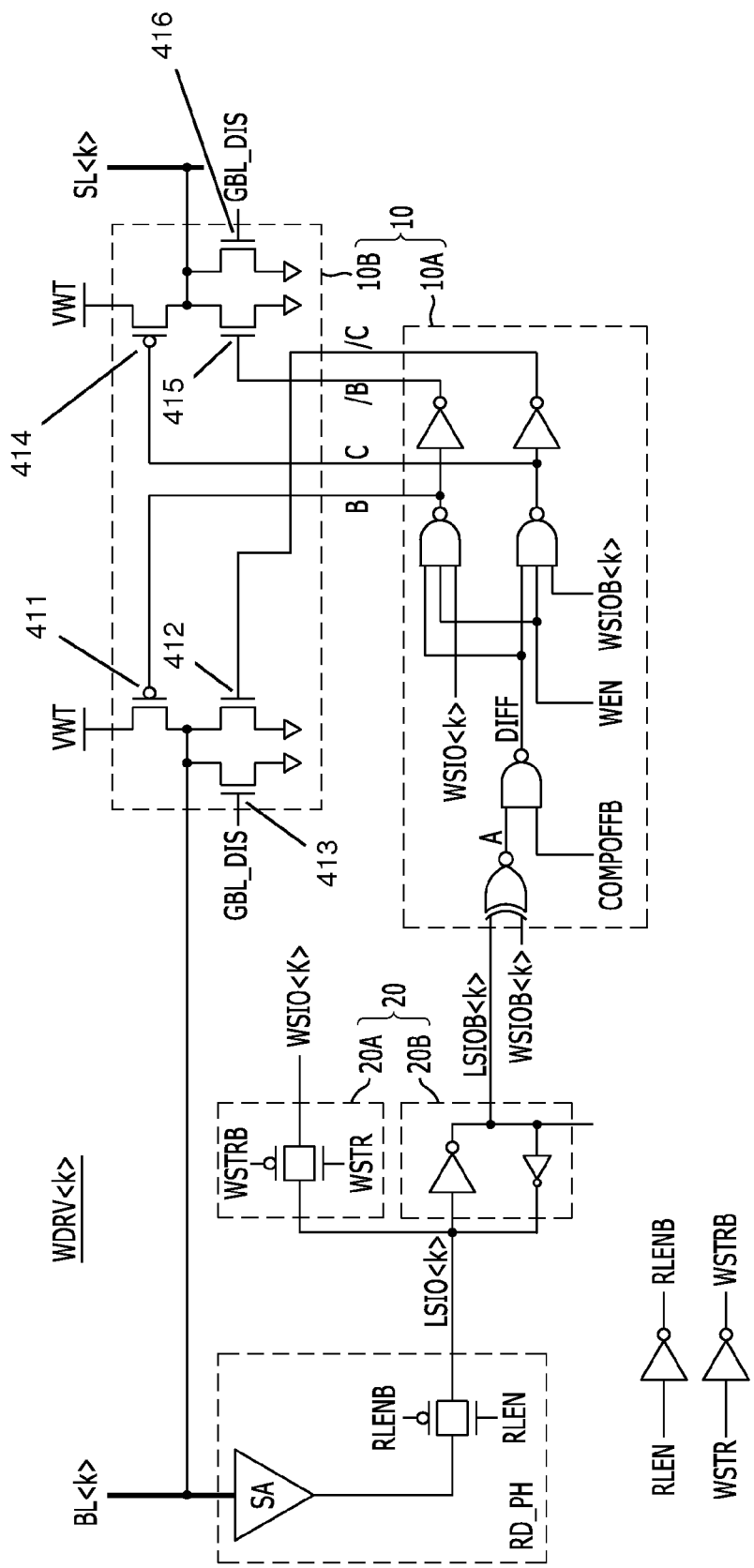
FIG. 4 is a configuration diagram illustrating one example of a write circuit illustrated in FIG. 3.
Figure 5:
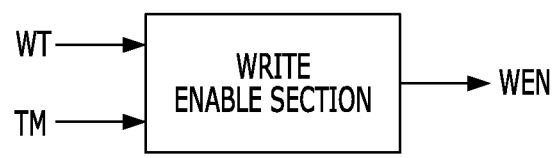
FIG. 5 is a configuration diagram illustrating one example of a write enable section included in a column control unit illustrated in FIG. 3.

FIG. 3 is a configuration diagram of one implementation of a memory circuit (device) including a variable resistance element R and a transistor ST, FIG. 4 is a configuration diagram illustrating an example of a unit write circuit illustrated in FIG. 3, and FIG. 5 is a configuration diagram illustrating an example of a common write enable section included in a column control unit illustrated in FIG. 3.

Referring to FIG. 3, a memory circuit may include a plurality of unit storage cells CELL<0> to CELL<m>, a plurality of unit write circuits WDRV<0> to WDRV<m>, a column control unit COL_CTRL, and a common pad EXT_PD. The plurality of unit write circuits WDRV<0> to WDRV<m> use external power VWT as the source power, and generate a cell current flowing through the plurality of unit storage cells CELL<0> to CELL<m> in response to a common write store signal WSTR, a common write enable signal WEN, and a plurality of write data WSIO<0> to WSIO<m>. The column control unit COL_CTRL generates the plurality of write data WSIO<0> to WSIO<m> corresponding to a plurality of input data DATA<0> to DATA<n> inputted through a plurality of data pads DQ<0> to DQ<n>. The column control unit COL_CTRL also generates the common write store signal WSTR and the common write enable signal WEN in response to a write command WT, an address ADD<m:n>, a clock CLK, and a test mode signal TM. The common pad EXT_PD receives the external power VWT from an external apparatus (not illustrated) and provides the received external power VWT to the unit write circuits. Through the common pad EXT_PD, the external apparatus measures cell current flowing through one or more of the plurality of unit storage cells CELL<0> to CELL<m>.

Each of the plurality of unit storage cells CELL<0> to CELL<m> may include a variable resistance element R and a transistor ST electrically coupled to one terminal of the variable resistor R (referring to FIGS. 2A and 2B). The resistance value of the variable resistance element R is changed according to the cell current flowing therethrough (referring to FIGS. 2A and 2B).

The plurality of unit write circuits WDRV<0> to WDRV<m> may commonly operate in response to the common write enable signal WEN and the common write store signal WSTR, and selectively generate the cell current flowing through the plurality of unit storage cells CELL<0> to CELL<m> in response to the plurality of write data WSIO<0> to WSIO<m>. Although the plurality of unit write circuits WDRV<0> to WDRV<m> are used to perform a write operation, the write circuits may include read circuits for reading read data from the plurality of unit storage cells CELL<0> to CELL<m> during a read operation.

FIG. 4 illustrates an example of the unit write circuit of FIG. 3. Each of the plurality of unit write circuits WDRV<0> to WDRV<m> may include a unit current generation section 10 and a unit storage section 20. The unit current generation section 10 generates a cell current flowing through a corresponding unit storage cell CELL<k> by using the external power VWT. The unit current generation section 10 operates according to polarities (logic values) of data WSIO<k> being currently written ("current write data"), as compared with already written and existing data LSIO<k> ("existing write data"), in response to the common write enable signal WEN. In response to the common write store signal WSTR, the unit storage section 20 stores the current write data WSIO<k> as the existing write data LSIO<k>.

The unit current generation section 10 may include a comparison part 10A and a write driver 10B. The comparison part 10A compares a logic value of inverted existing write data LSIOB<k> with a logic value of inverted current write data WSIOB<k> in response to a comparison-off signal COMPOFFB and the common write enable signal WEN. The comparison-off signal COMPOFFB is activated in a specific operation mode to turn off a comparison function of the comparison part 10A. A detailed operation of the comparison-off signal is omitted. The write driver 10B is electrically coupled between the common pad EXT_PD (referring to FIG. 3) and a ground voltage (VSS) terminal. The write driver 10B generates the cell current flowing through the corresponding unit storage cell CELL<k> in response to first and second differential comparison signals (B, /B, C, or /C) that are outputted from the comparison part 10A. The comparison part 10A may include a first exclusive NOR gate, a first NAND gate, a second NAND gate, a first inverter, a third NAND gate, and a second inverter. The first exclusive NOR gate performs an exclusive NOR operation on the inverted existing write data LSIOB<k> and the inverted current write data WSIOB<k>. The first NAND gate performs a NAND operation on an output signal A of the first exclusive NOR gate and the comparison-off signal COMPOFFB. The second NAND gate performs a NAND operation on an output signal DIFF of the first NAND gate, the common write enable signal WEN, and the current write data WSIO<k>. The second NAND gate outputs a first positive comparison signal B. The first inverter inverts the first positive comparison signal B and outputs a first negative comparison signal /B. The third NAND gate performs a NAND operation on the output signal DIFF of the first NAND gate, the common write enable signal WEN, and the inverted current write data WSIOB<k>. The third NAND gate outputs a second positive comparison signal C. The second inverter inverts the second positive comparison signal C and outputs a second negative comparison signal /C.

The write driver 10B may include a first PMOS transistor 411, a first NMOS transistor 412, a second NMOS transistor 413, a second PMOS transistor 414, a third NMOS transistor 415 and a fourth NMOS transistor 416. The first PMOS transistor 411 receives the first positive comparison signal B as gate input and has a source and a drain electrically coupled between the common pad EXT_PD and a bit line BL<k>. The first NMOS transistor 412 receives the second negative comparison signal /C as gate input and has a drain and a source electrically coupled between the bit line BL<k> and the ground voltage (VSS) terminal. The second NMOS transistor 413 receives a global bit line discharge signal GBL_DIS as gate input and has a drain and a source electrically coupled between the bit line BL<k> and the ground voltage (VSS) terminal. The second PMOS transistor 414 receives the second positive comparison signal C as gate input and has a source and a drain electrically coupled between the common pad EXT_PD and a source line SL<k>. The third NMOS transistor 415 receives the first negative comparison signal /B as gate input and has a drain and a source electrically coupled between the source line SL<k> and the ground voltage (VSS) terminal. The fourth NMOS transistor 416 receives the global bit line discharge signal GBL_DIS as gate input and has a drain and a source electrically coupled between the source line SL<k> and the ground voltage (VSS) terminal.

The unit storage section 20 may include a first transmission gate 20A and a first latch part 20B. The first transmission gate 20A selectively transmits the current write data WSIO<k> in response to the common write store signal WSTR and an inverted common write store signal WSTRB. The first latch part 20B latches the current write data WSIO<k> which has been transmitted through the first transmission gate 20A, as the existing write data LSIO<k>.

Each of the plurality of unit write circuits WDRV<0> to WDRV<m> may further include a unit read circuit RD_PH electrically coupled between the bit line BL<k> and the latch part 20B. The unit read circuit RD_PH may include a unit sense amplifier SA and a second transmission gate. The unit sense amplifier SA, which is electrically coupled to the bit line BL<k>, amplifies read data transmitted through the bit line BL<k> during a read mode. The second transmission gate transmits the read data, which is outputted from the unit sense amplifier SA, to the latch part 20B in response to common read enable signals RLEN and RLENB. A detailed description on the unit read circuit RD_PH will be omitted.

Referring back to FIG. 3, the column control unit COL_CTRL may include various circuits related to a column operation, for example, a decoder, a data input/output circuit and the like. As illustrated in FIG. 4, the column control unit COL_CTRL may include a common write enable section for generating the common write enable signal WEN in response to the write command WT and the test mode signal TM. The common write enable section may operate to generate the common write enable signal WEN with a longer activation width when the test mode signal TM is activated than that when the test mode signal TM is deactivated. In other words, the common write enable section may generate the common write enable signal WEN with a longer activation width in a test mode than in a normal mode.

In one implementation, the common pad EXT_PD may include a general purpose pad for receiving the external power VWT in the normal mode and the test mode. In another implementation, the common pad EXT_PD may include a dedicated pad for receiving the independent external power VWT only in the test mode.

Hereinafter, a driving method of operating the memory circuit will be described based on the aforementioned content with reference to FIG. 6 to FIG. 8.

For the ease of understanding, as one example, a write operation process will be described, through which input data DATA<0> to DATA<31> with a burst length of '4' is written through 32 data pads DQ<0> to DQ<31>.

Figure 8:

FIG. 6 is a timing diagram for explaining an example of a driving method of the memory circuit illustrated in FIG. 3, FIG. 7 is a table for facilitating the understanding of the driving method, and FIG. 8 is a table illustrating logic values of existing write data and current write data.

In the description below, as one implementation, the cell current flowing through one storage cell CELL<k> is measured.

Referring to FIGS. 3, 4, 6 and FIG. 7, the method of driving the memory circuit may include first and second write periods WT1 and WT2 where the common write enable signal WEN and the common write store signal WSTR are activated, respectively.

During the first write period WT1, the following processes are carried out. The data with a logic value 'low (0)' is written during the first write period WT1. The source line SL<k> has a logic value 'Low (0)'. First to $32^{nd}$ input data DATA<0> to DATA<31>with a burst length of '4' are inputted through first to $32^{nd}$ data pads DQ<0> to DQ<31>. The column control unit COL_CTRL outputs first to 128th write data WSIO<0> to WSIO<127> to first to 128th write circuits WDRV<0> to WDRV<127> in a parallel manner. The first to 128th write data WSIO<0> to WSIO<127> outputted corresponds to the first to $32^{nd}$ input data DATA<0> to DATA<31>, each input data has a burst length of four. In response to the common write enable signal WEN, the first to 128th write circuits WDRV<0> to WDRV<127> supply currents to first to 128th storage cells CELL<0> to CELL<127>. The currents supplied to first to 128th storage cells CELL<0> to CELL<127> allow to store the first to 128th write data WSIO<0> to WSIO<127> with a logic value 'low (0),' respectively.

Once the data with a logic value 'low (0)' is written in the first to 128th storage cells CELL<0>to CELL<127>during the first write process WT1, in response to the common write store signal WSTR, the first to 128th write circuits WDRV<0> to WDRV<127> temporarily store the first to 128th write data WSIO<0> to WSIO<127> in the storage sections 20. The write data stored in the respective storage sections 20 corresponds to existing write data LSIO<0> to LSIO<127>.

During the second write process WT2, the following processes proceed. The data with a logic value 'high (1)' is written during the second write period WT2. The bit line BL<k> has a logic value 'Low (0)' and the source line SL<k> has a logic value 'high (1)'. The first to 32th input data DATA<0> to DATA<31> with a burst length of '4' is inputted through the first to 32th data pads DQ<0> to DQ<31>. The column control unit COL_CTRL outputs the first to 128th write data WSIO<0> to WSIO<127> to the first to 128th write circuits WDRV<0> to WDRV<127> in a parallel manner. The first to 128th write data WSIO<0> to WSIO<127> outputted corresponds to the first to 32th input data DATA<0> to DATA<31>, each having a burst length of four. In response to the common write enable signal WEN, the first to 128th write circuits WDRV<0> to WDRV<127>, which correspond to first to 128th write data WSIO<0> to WSIO<127>, supply currents to a storage cell CELL<k> when the corresponding first to 128th write data WSIO<0> to WSIO<127> have a logic value 'high (1)'.

During the second write process WT2, any write data among the first to $128^{th}$ write data WSIO<0> to WSIO<127> with a logic value 'high (1)' is only written in the corresponding cell among first to $128^{th}$ storage cells CELL<0> to CELL<127>. In writing data having logic value 'high (1),' the first to $128^{th}$ write circuits WDRV<0> to WDRV<127> operate to change resistance values of the corresponding storage cells only when the corresponding storage cells have their logic values of 'low (0).' Such change of the resistance values allows each of the corresponding storage cells to have a logic value 'high (1).' For example, assuming that write data <k> among the first to $128^{th}$ write data WSIO<0> to WSIO<127> has a logic value 'high (1)' and its corresponding storage cell CELL<k> has a logic value 'low (0).' In other words, the current write data WSIO<k> has a logic value 'high (1)', while the existing write data LSIO<k> has a logic value 'low (0).' In this case, a corresponding write circuit WDRV<k> generates a cell current in the corresponding storage cell CELL<k> in a second direction (the source line SL<k>→the storage cell CELL<k>→the bit line BL<k>).

As illustrated in FIG. 8 in connection with FIGS. 3, 4, 6 and 7, in the first write period WT1, the first to 128th write data WSIO<0> to WSIO<127> with a logic value 'low (0)' is written in the first to 128th storage cells CELL<0> to CELL<127>. In the second write period WT2, any write data WSIO<k> among the first to 128th write data WSIO<0> to WSIO<127>, which has a logic value 'high (1)', is written in the corresponding storage cell CELL<k> among the first to 128th storage cells CELL<0> to CELL<127>. In this case, the storage cell CELL<k> is subject to current measurement and thus, cell current of the storage cell CELL<k> is to be measured.

When current (target current) flows through a corresponding storage cell CELL<k>, such current can be measured through the common pad EXT_PD from an exterior. At this time, since the current (the target current) measured from an exterior may include peripheral current (unit current) in addition to the cell current (the storage current), the accurate cell current (storage current) is measured only when the peripheral current (the unit current) is subtracted from the measured current (the target current). For example, the peripheral current (the unit current) can be measured through the common pad EXT_PD by performing a third write process (not illustrated) in which the first to $128^{th}$ write data WSIO<0> to WSIO<127> with a logic value 'low (0)' is written one more time after the first write period WT1.

According to the memory device as described above, it is possible to measure the cell current flowing through one or more target storage cells CELL<k> through the first and second write periods WT1 and WT2.

In the above implementations, it is possible to read the logic value of stored data with a large margin.

The above and other memory circuits or semiconductor devices based on the disclosed technology can be used in a range of devices or systems. FIGS. 9-13 provide some examples of devices or systems that can implement the memory circuits disclosed herein.

Figure 9:
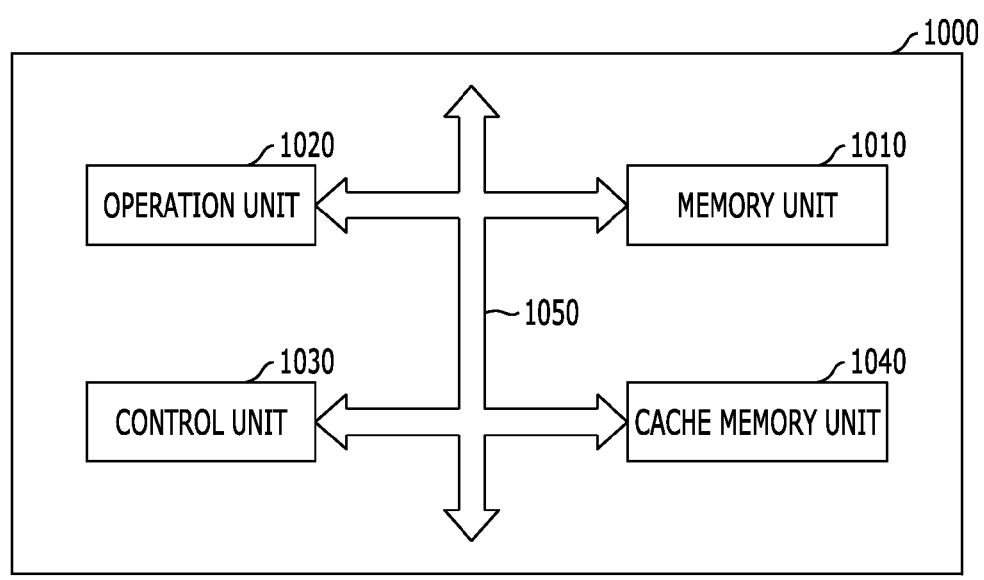
FIG. 9 shows an example of a configuration diagram of a microprocessor implementing memory circuitry based on the disclosed technology.

FIG. 9 shows an example of a configuration diagram of a microprocessor based on another implementation of the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the memory unit 1010 may be improved. Since the memory unit 1010 can be improved in terms of the operating precision, the performance of the microprocessor 1000 can be improved as well.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
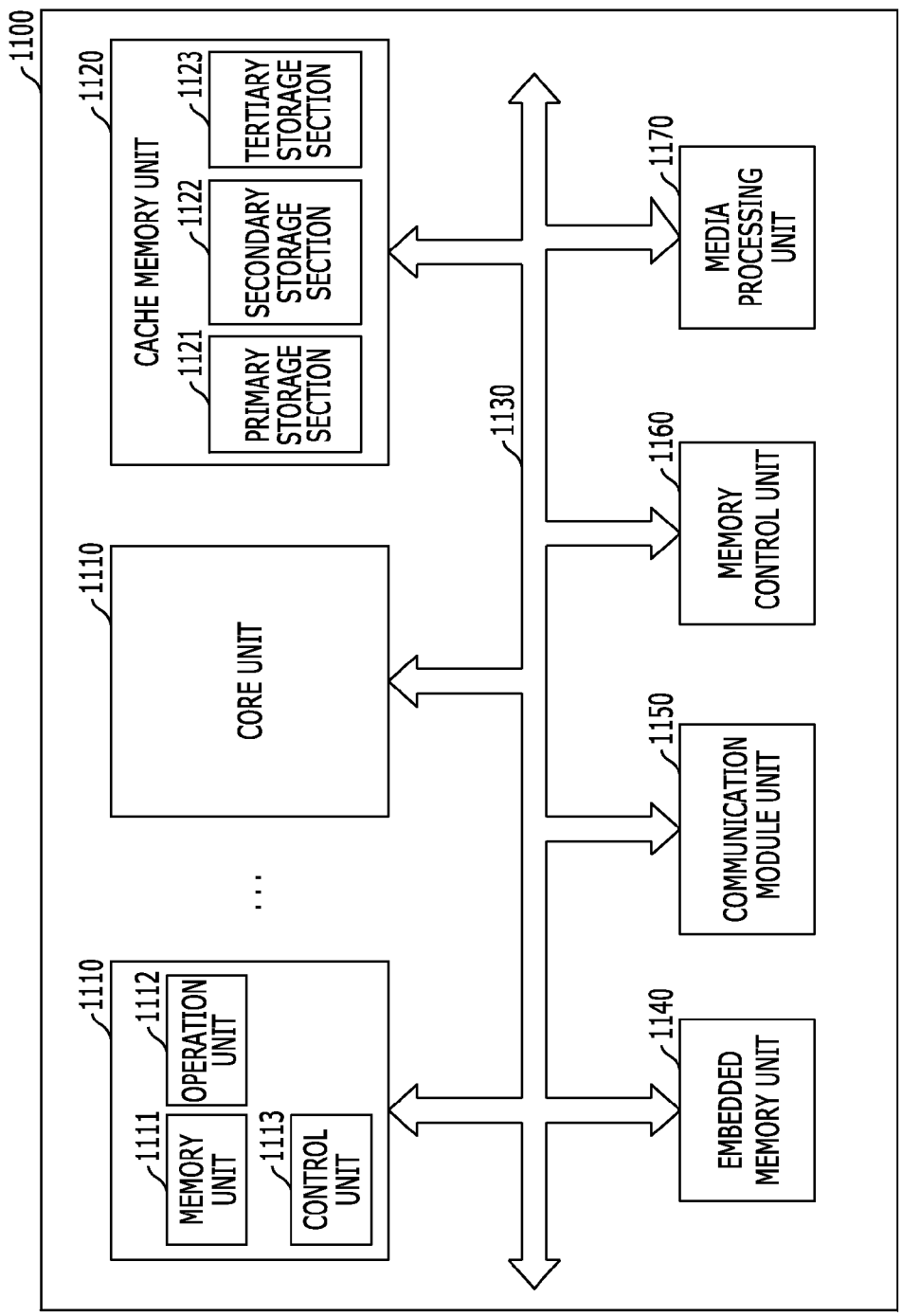
FIG. 10 shows an example of a configuration diagram of a processor implementing memory circuitry based on the disclosed technology.

FIG. 10 is a configuration diagram of a processor based on another implementation of the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the cache memory unit 1120 may be improved. Since the cache memory unit 1120 can be improved in terms of the operating precision, the performance of the core unit 1110 can be improved as well.

Although it was shown in FIG. 10 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
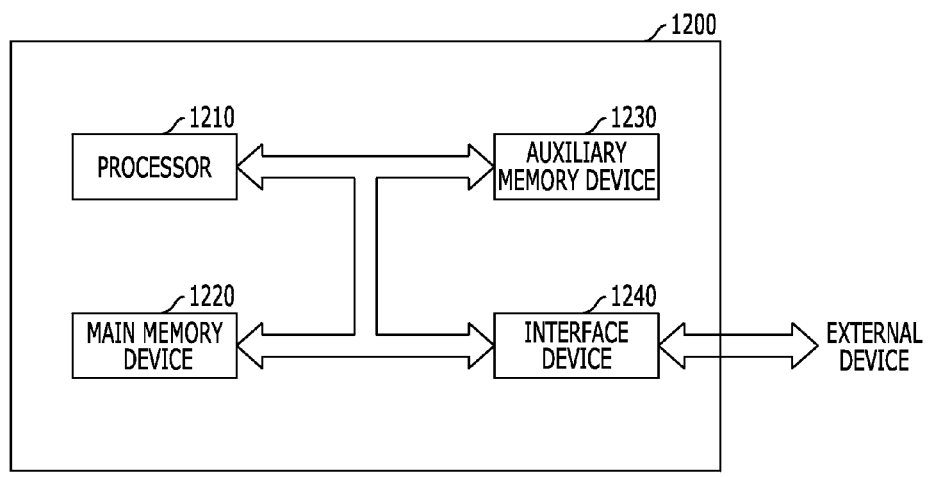
FIG. 11 shows an example of a configuration diagram of a system implementing memory circuitry based on the disclosed technology.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the main memory device 1220 may be improved. Since the main memory device 1220 can be improved in terms of the operating precision, the portability and performance of the system 1200 can be improved as well.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the auxiliary memory device 1230 may be improved. Since the auxiliary memory device 1230 can be improved in terms of operating precision, the performance of the system 1200 can be improved as well.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
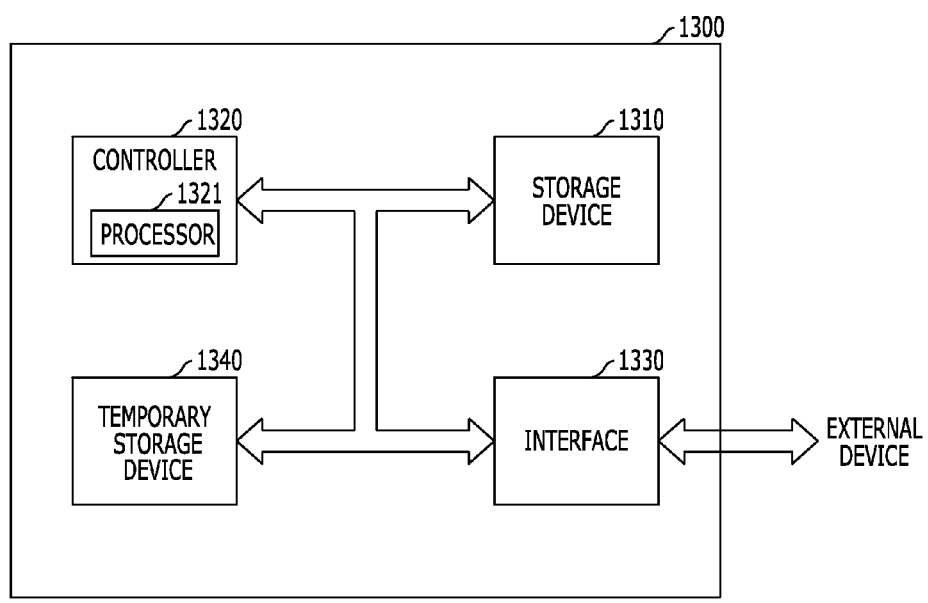
FIG. 12 shows an example of a configuration diagram of a data storage system implementing memory circuitry based on the disclosed technology.

FIG. 12 is a configuration diagram of a data storage system based on another implementation of the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the storage device 1310 or the temporary storage device 1340 may be improved. Since the storage device 1310 or the temporary storage device 1340 can be improved in terms of the operating precision, the performance of the data storage system 1300 can be improved as well.

Figure 13:
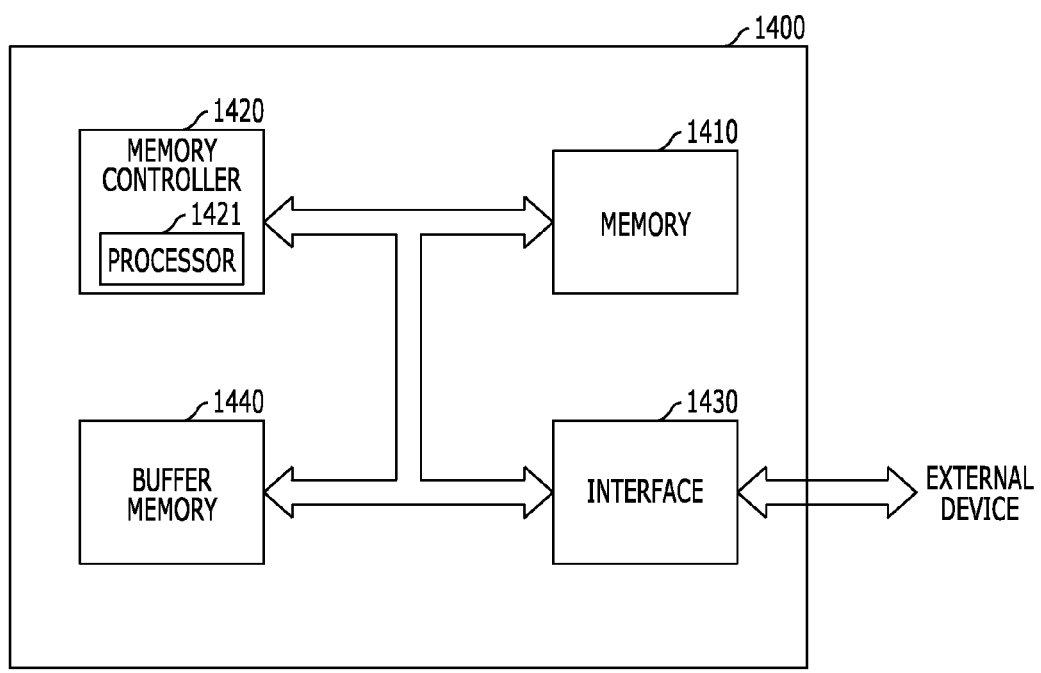
FIG. 13 shows an example of a configuration diagram of a memory system implementing memory circuitry based on the disclosed technology.

FIG. 13 is a configuration diagram of a memory system based on another implementation of the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the memory 1410 may be improved. Since the memory 1410 can be improved in terms of the operating precision, the performance of the memory system 1400 can be improved as well.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a unit storage cell including a variable resistor having a resistance value that is changed according to current flowing through both terminals of the variable resistor; a unit current generation section that compares existing data with write data of the unit storage cell, and generates the current by using external power according to a comparison result; and a pad that receives the external power from an exterior and allows the current to be measured from an exterior. It is possible to measure cell current flowing through one or more storage cells, so that it is possible to obtain an accurate distribution of the cell current. Furthermore, it is possible to measure cell current flowing through one or more storage cells without a separate additional circuit, resulting in an advantageous effect in terms of an area. Through this, the operating precision of the buffer memory 1440 may be improved. Since the buffer memory 1440 can be improved in terms of the operating precision, the performance of the memory system 1400 can be improved as well.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory includes:
   unit storage cells to store data, each unit storage cell including a variable resistance element having a resistance value that can be changed according to a current flowing through the variable resistance element;
   unit current generation sections that are coupled to the unit storage cells, respectively, one unit current generation section being designated to only one corresponding unit storage cell to compare existing data stored in the unit storage cell with write data to be stored in the unit storage cell to produce a comparison result, and generating the current to be supplied to the unit storage cell by using external power according to the comparison result; and
   a pad coupled to the unit current generation sections and operated to receive the external power from an exterior and provide the received external power to each unit current generation section to allow the current to be measured from an exterior.

2. The electronic device of claim 1, wherein the unit current generation section generates the current when the write data having a value different from a value of the existing data is inputted.

3. The electronic device of claim 1, wherein the unit current generation section includes:
   a comparison part that compares the existing data with the write data; and
   a driver that is electrically coupled between the pad and a ground voltage terminal, and generates the current in response to the comparison result of the comparison part.

4. The electronic device of claim 1, wherein the variable resistance element includes metal oxide or phase change material and includes a tunnel barrier layer interposed between two magnetic layers.

5. The electronic device of claim 1, wherein the unit storage cell further includes:
   a selection element that is electrically coupled to the variable resistance element to supply the current to the variable resistance element.

6. The electronic device of claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed, wherein the semiconductor memory is part of the memory unit in the microprocessor.

7. The electronic device of claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

8. The electronic device of claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

9. The electronic device of claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

10. The electronic device of claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

11. The electronic device of claim 1, wherein the semiconductor memory includes:

a plurality of additional unit storage cells, each additional unit storage cell being similarly constructed as the unit storage cell to include a corresponding variable resistance element having a resistance value that can be changed according to a corresponding current flowing through the corresponding variable resistance element;

a plurality of unit storage sections that store existing write data corresponding to the additional unit storage cells and the unit storage cell, respectively, in response to a common write store signal;

a plurality of additional unit current generation sections that are coupled to the additional storage cells, respectively, each additional unit current generation section being similarly structured as the unit current generation section to compare existing write data with current write data in response to a common write enable signal applied to each additional unit current generation section and the unit current generation section, to produce a corresponding comparison result, and to selectively generate the corresponding current in a corresponding additional unit storage cell by using the external power according to the corresponding comparison result; and wherein the common pad is coupled to provide the received external power to the additional unit current generation sections and allow a corresponding current flowing through each additional unit storage cells to be measured from an exterior.

12. The electronic device of claim 11, further comprising:

a common write enable section that generates the common write enable signal in response to a test mode signal and a write command, wherein the common write enable section lengthens an activation width when the test mode signal is activated, as compared with a case in which the test mode signal is deactivated, and generates the common write enable signal.

13. The electronic device of claim 11, wherein each additional unit storage cell includes a first terminal and a second terminal and the electronic device further includes:

a plurality of bit lines electrically coupled to first terminals of the additional unit storage cells and the unit storage cell, respectively; and a plurality of source lines electrically coupled to second terminals of the additional unit storage cells and the unit storage cell, respectively, wherein each unit current generation section for each unit storage cell is electrically coupled between a corresponding bit line and a corresponding source line coupled to the unit storage.

14. The electronic device of claim 13, further including:

a plurality of unit sense amplifiers that are electrically coupled to the plurality of bit lines, respectively, and amplify a plurality of read data transmitted through the plurality of bit lines in a read mode, wherein the plurality of unit storage sections is operated to store the plurality of read data in response to a common read enable signal.

15. An electronic device including a semiconductor memory, wherein the semiconductor memory includes:

unit storage cells storing data; each storage cell including a variable resistance element having a resistance value that can be changed according to a current flowing therethrough;

a column control unit providing data to be written into the unit storage cells and generating a common write enable signal;

unit write circuits connected to the unit storage cells, respectively, and operates in response to the common write enable signal, wherein each unit write circuit is designated to only one corresponding unit storage cell and selectively supplies a current to a corresponding storage cell using a voltage supplied from outside such that the current flowing through the storage cell causes data stored in the storage cell to change between different values; and an external pad arranged between the unit write circuits and an external apparatus to supply power from outside to the unit write circuits and to facilitate measuring a current flowing through a storage cell.

16. The electronic device of claim 15, wherein each unit write circuit supplies a current to a storage cell when data to be written to the storage cell is different from data already written and existing in the storage cell.

17. The electronic device of claim 15, wherein each unit write circuit compares data to be written into a corresponding unit storage cell with data already written and existing in the corresponding unit storage cell.

18. The electronic device of claim 15 further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

19. The electronic device of claim 15, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

20. The electronic device of claim 1, wherein, to all of the unit storage cells, first write data having a first logic value is written during a first write period and, to at least one unit storage cell, at least one second write data having a second logic value different from the first logic value is selectively written to measure current flowing through the at least one unit storage cell.

* * * * *